United States Patent
Zurek et al.

(10) Patent No.: US 9,826,645 B2
(45) Date of Patent: Nov. 21, 2017

(54) CIRCUIT SUBSTRATE AND METHOD FOR MANAGING THE PLACEMENT OF ONE OR MORE CAPACITORS

(71) Applicant: Motorola Mobility LLC, Chicago, IL (US)

(72) Inventors: Robert Zurek, Antioch, IL (US); Robert M Netz, Grayslake, IL (US)

(73) Assignee: Motorola Mobility LLC, Chicago, IL (US)

( * ) Notice: Subject to any disclaimer, the term of this patent is extended or adjusted under 35 U.S.C. 154(b) by 22 days.

(21) Appl. No.: 14/969,390

(22) Filed: Dec. 15, 2015

(65) Prior Publication Data

US 2017/0171984 A1    Jun. 15, 2017

(51) Int. Cl.
*H05K 7/00* (2006.01)
*H05K 3/32* (2006.01)
(Continued)

(52) U.S. Cl.
CPC .............. *H05K 3/32* (2013.01); *H05K 1/181* (2013.01); *H05K 3/303* (2013.01); *H05K 2201/10015* (2013.01); *H05K 2201/10522* (2013.01)

(58) Field of Classification Search
CPC .. H01G 4/12; H01G 4/30; H01G 4/35; H01G 4/232; H01G 4/2325; H01G 4/38;
(Continued)

(56) References Cited

U.S. PATENT DOCUMENTS

| | | | | |
|---|---|---|---|---|
| 5,663,529 | A | * | 9/1997 | McMillan, II ....... H05K 1/0209 174/252 |
| 2009/0189269 | A1 | * | 7/2009 | Leung ................. H01L 23/5387 257/690 |

(Continued)

OTHER PUBLICATIONS

Power Integrity Design_IEEE 2012.*

*Primary Examiner* — Timothy Thompson
*Assistant Examiner* — Guillermo Egoavil
(74) *Attorney, Agent, or Firm* — Watson Intellectual Property Group

(57) ABSTRACT

The present application provides a circuit substrate and a method of managing the placement of one or more groupings of a plurality of capacitors coupled to a circuit substrate. Each capacitor has a pair of terminals, as well as a component shape which changes as a voltage difference is selectively applied across the pair of terminals. When a voltage difference is applied across the pair of terminals, the component shape of the capacitor will contract in a first direction and expand in a second direction, where the second direction is substantially orthogonal to the first direction. When the voltage difference is removed from the pair of terminals, the component shape of the capacitor will return to an uncontracted state in the first direction and an unexpanded state in the second direction. Each of the plurality of capacitors in a particular grouping is driven by a complementary signal. The method includes arranging each of the plurality of capacitors in the particular grouping, which are positioned within a relative distance of one another that is less than or equal to a quarter wavelength of a predetermined frequency, where at least some of the plurality of capacitors in the particular grouping are positioned to exert opposite influences on the circuit substrate relative to other capacitors in the particular group, in response to the plurality of capacitors
(Continued)

in the particular grouping being driven by the complementary signal.

21 Claims, 8 Drawing Sheets

(51) Int. Cl.
*H05K 3/30* (2006.01)
*H05K 1/18* (2006.01)

(58) Field of Classification Search
CPC .......... H05K 1/181; H05K 3/32; H05K 3/303; H05K 3/3442; H05K 2201/10015; H05K 2201/10522
USPC ...... 29/24.42; 156/182; 174/260; 361/306.3, 361/311, 782; 427/79
See application file for complete search history.

(56) References Cited

U.S. PATENT DOCUMENTS

2011/0222255 A1* 9/2011 Kitano .............. H01L 23/49827
361/782
2014/0332261 A1* 11/2014 Fujimoto ................. H01G 4/30
174/260

* cited by examiner

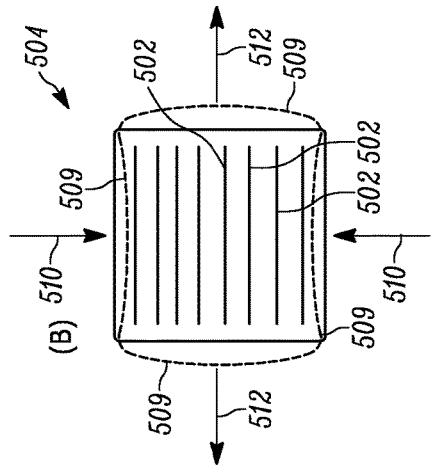
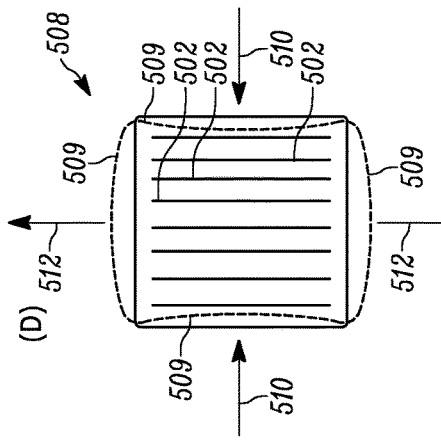
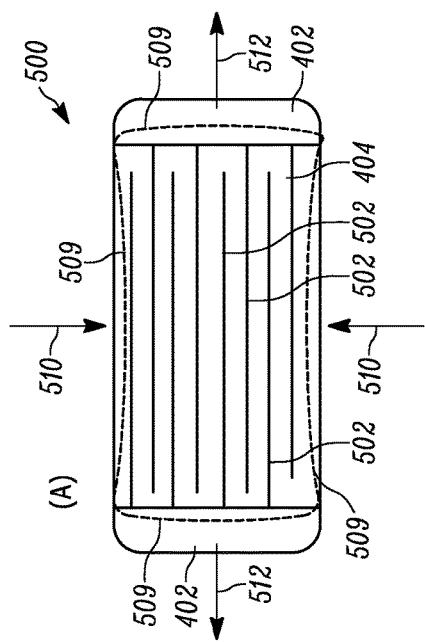
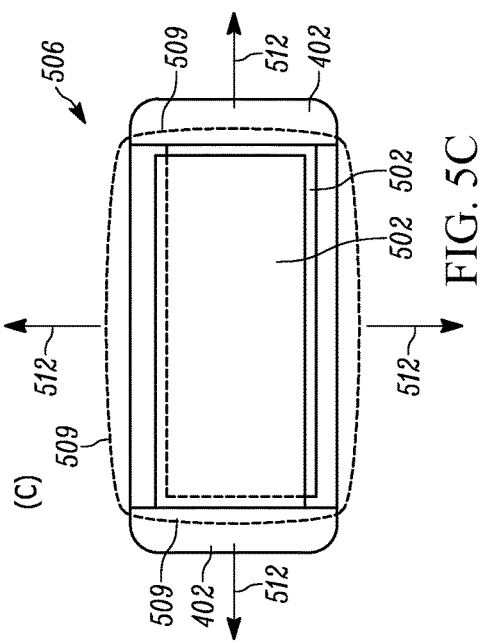

CIRCUIT SUBSTRATE AND METHOD FOR MANAGING THE PLACEMENT OF ONE OR MORE CAPACITORS

FIELD OF THE APPLICATION

The present disclosure relates generally to the placement of components upon a circuit substrate, and more particularly, to the management of component placement, where the components are capable of generating a vibrational effect in the circuit substrate upon which the components are coupled.

BACKGROUND

When a voltage differential is received across a pair of terminals in some components such as a capacitor having one or more sets of parallel plates, portions of the component can sometimes experience an attraction toward one another, which can result in a mechanical deformation in the component. In at least some instances, the deformation can be temporary, where when the voltage differential is removed, the component will substantially return to its undeformed state. In such an instance, when the voltage differential being applied is periodic in nature, a cycle of repeated deformations, which can include repeated contractions and expansions, can be produced.

In some of these instances, the repeated deformations, can produce a vibration having a frequency and amplitude, which will induce an auditory perceivable piezoelectric type effect. In at least some instances, the repeated deformation in the component can result in a vibration being induced in another nearby structure, such as a circuit substrate, which may be ultimately responsible for producing the auditory perceivable signal. In some such instances, multiple components being driven by a complementary signal may be arranged such that they together contribute in an additive manner to the nearby structure so as to result in the audibly detectable vibration.

Multiple components, such as capacitors, can be commonly associated with a complimentary signal, such as a power supply line to high current components. At least one example can include a radio frequency power amplifier in a cellular radio telephone type application. While in most instances, the capacitors are often sufficiently small so as to limit any corresponding vibration from producing a meaningful source of an auditory signal in the capacitor itself, when the capacitor exhibiting such an effect is mounted to a circuit substrate, such as a printed circuit board and/or the related metal shields, which generally will often have a much greater surface area, the capacitor can act as a point source mechanical exciter of the substrate. When grouped together with other point source mechanical exciters that add in a constructive manner at a frequency of concern, the multiple point source mechanical exciters can sometimes produce a perceivable effect in the circuit substrate.

Traditionally, the occurrence of such an affect between multiple commonly driven capacitors and an associated circuit substrate has been harder to manage and predict, because the way capacitors were previously manufactured and packaged resulted in a random orientation of the capacitors in the parts reels, and thus a more random arrangement of the various geometries of the capacitors relative to the surfaces of the circuit substrate upon which the components are received. As such, the effect might only randomly occur in a lot of produced boards. In such instances, past techniques for addressing any present audible noise in a particular board could include moving or removing one or more of the capacitors, adding a screw boss to the board to reduce movement, and selecting capacitors that did not exhibit the vibratory effect as strongly, such as tantalum capacitors. However, removing capacitors from a particular board can sometimes cause instability in the circuit. Adding additional screw bosses can affect circuit density and component placement including the placement of components relative to the circuit substrate, as well as the placement of components between the circuit substrate and the housing to which the substrate is being attached. Furthermore, the use of tantalum capacitors in some situations, such as on power lines, can be a safety hazard.

The present innovators have correspondingly recognized that recent changes, by capacitor manufacturers which allow capacitor orientation within a reel and correspondingly on a circuit substrate to be more predictable has allowed circuit board layout artists and designers to better anticipate and control the possible vibratory effects that placement of certain components can have upon a circuit substrate, and correspondingly the placement and orientation of components can be better managed to reduce the overall undesired vibratory effect that might be produced by the proximate placement of multiple components upon a circuit substrate.

SUMMARY

The present application provides a method of managing the placement of one or more groupings of a plurality of capacitors coupled to a circuit substrate. Each capacitor has a pair of terminals, as well as a component shape which changes as a voltage difference is selectively applied across the pair of terminals. When a voltage difference is applied across the pair of terminals, the component shape of the capacitor will contract in a first direction and expand in a second direction, where the second direction is substantially orthogonal to the first direction. When the voltage difference is removed from the pair of terminals, the component shape of the capacitor will return to an uncontracted state in the first direction and an unexpanded state in the second direction. Each of the plurality of capacitors in a particular grouping is driven by a complementary signal. The method includes arranging each of the plurality of capacitors in the particular grouping, which are positioned within a relative distance of one another that is less than or equal to a quarter wavelength of a predetermined frequency. At least some of the plurality of capacitors in the particular grouping are positioned to exert opposite influences on the circuit substrate relative to other capacitors in the particular group, in response to the plurality of capacitors in the particular grouping being driven by the complementary signal.

The present application further provides a circuit substrate. The circuit substrate includes one or more groupings of capacitors, each grouping including a plurality of capacitors driven by a complementary signal, wherein each capacitor has a pair of terminals, and a component shape, which changes when a voltage difference across the two terminals is selectively applied. The component shape of the capacitor will contract in a first direction and expand in a second direction, where the second direction is substantially orthogonal to the first direction. When the voltage difference is removed from the pair of terminals, the component shape of the capacitor will return to an uncontracted state in the first direction and an unexpanded state in the second direction. The plurality of capacitors in a particular grouping are positioned within a relative distance of one another that is less than or equal to a quarter wavelength of a predetermined frequency. At least some of the plurality of capacitors in the particular grouping are positioned to exert opposite influences on the circuit substrate relative to other capacitors in the particular group, in response to the plurality of capacitors in the particular grouping being driven by the complementary signal.

In at least one embodiment, the circuit substrate further comprises one or more additional components dissimilar to the capacitors included in the one or more groupings, which in response to the complementary signal will produce an expansion or contraction relative to a surface of the additional component that is in contact with the circuit substrate when the voltage differential is received. A capacitor from the one or more groupings, which is positioned proximate the additional component will be oriented relative to the circuit substrate so as to exert an opposite influence on the circuit substrate than the additional component when the voltage differential associated with complementary signals is respectively received across a pair of terminals in each of the additional component and the capacitor positioned proximate the additional component.

These and other features, and advantages of the present disclosure are evident from the following description of one or more preferred embodiments, with reference to the accompanying drawings.

BRIEF DESCRIPTION OF THE DRAWINGS

FIGS. 5A through 5D are various different internal side views of an exemplary capacitor highlighting the orientation and arrangement of multiple substantially parallel conductive plates situated within the exemplary capacitor;

DETAILED DESCRIPTION OF THE PREFERRED EMBODIMENT(S)

Figure 1:
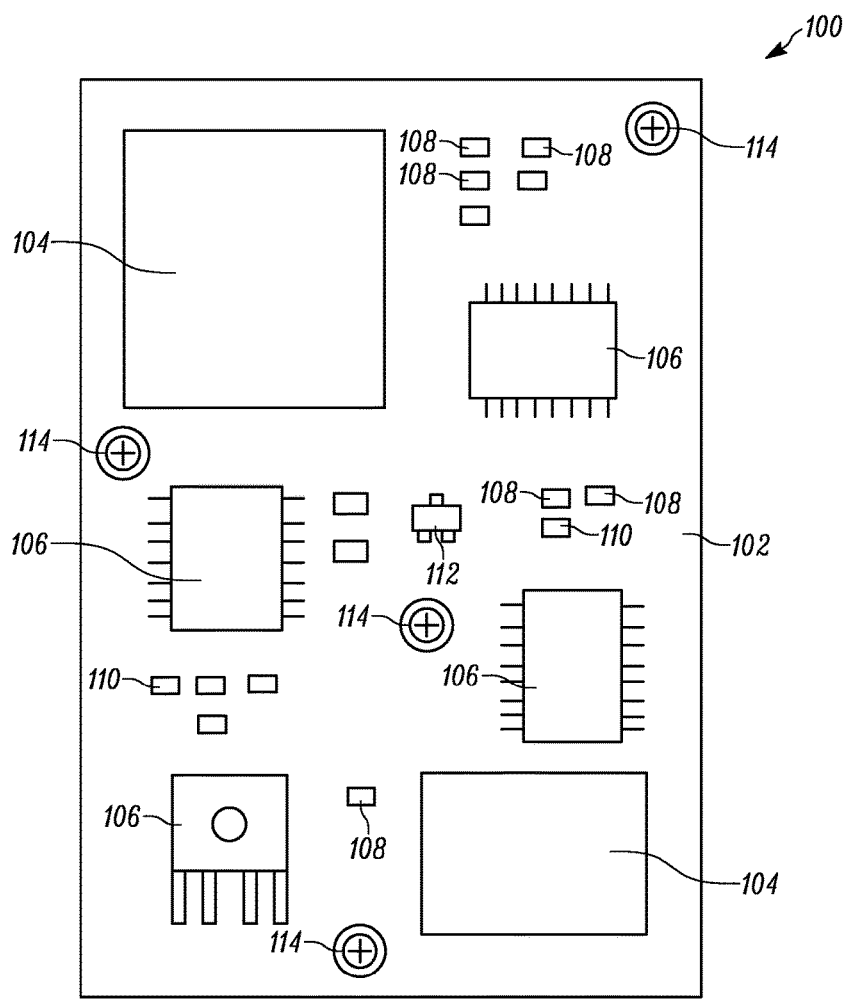
FIG. 1 is a top view of an exemplary circuit substrate.

While the present invention is susceptible of embodiment in various forms, there is shown in the drawings and will hereinafter be described presently preferred embodiments with the understanding that the present disclosure is to be considered an exemplification and is not intended to limit the invention to the specific embodiments illustrated. One skilled in the art will hopefully appreciate that the elements in the drawings are illustrated for simplicity and clarity and have not necessarily been drawn to scale. For example, the dimensions of some of the elements in the drawings may be exaggerated relative to other elements with the intent to help improve understanding of the aspects of the embodiments being illustrated and described.

FIG. 1 illustrates a top view of an exemplary circuit substrate 100. In the illustrated embodiment, the circuit substrate 100 includes one or more largely planar sides 102 of the substrate upon which one or more components can be attached. The components can include various modules 104, integrated circuits (ICs) 106 and discrete elements. The discrete elements can include individually packaged circuit elements, such as capacitors 108, resistors 110 and transistors 112. The modules can often include their own printed circuit board, that can similarly include one or more circuit elements, which are sometimes encased in a housing. The various components often make an electrical and/or mechanical connection with the circuit substrate through one or more terminals and/or leads. The circuit substrate can often also include mounting holes through which a fastener 114, such as a screw, can be received for attaching the circuit substrate 100 to other device components, such as a device housing. The device housing can include a boss attached to or formed into the same for receiving an end of the fastener 114. It is further possible, that still other types of components could similarly be included in the list of elements that could be coupled to the circuit substrate without departing from the teachings of the present application. Still further, various shown elements could additionally or alternatively include other form factors including different shapes, sizes and number of terminal/leads, as well as through hole as opposed to surface mount type connectivity with the circuit substrate 100.

In at least some instances, the circuit substrate 100 can include a printed circuit board, which can include one or more laminated layers within which conductive traces can be etched so as to provide a conductive path for conveying signals between pads upon which the various terminals and/or leads of the components can be received and affixed. Some of the conductive layers can be located upon one or more external sides (i.e. the front side or back side) of the board. Conductive layer can also be located internally within the structure of the board, where the various conductive trace layers are separated by a non-conductive layer, such as a layer made from a glass epoxy in rigid type printed circuit board structures, in order to minimize the likelihood of non-intentional electrical conduction of signals between nearby conductive trace layers. Intentional electrical connections between conductive trace layers can often be facilitated using plated through holes called vias.

Figure 2:
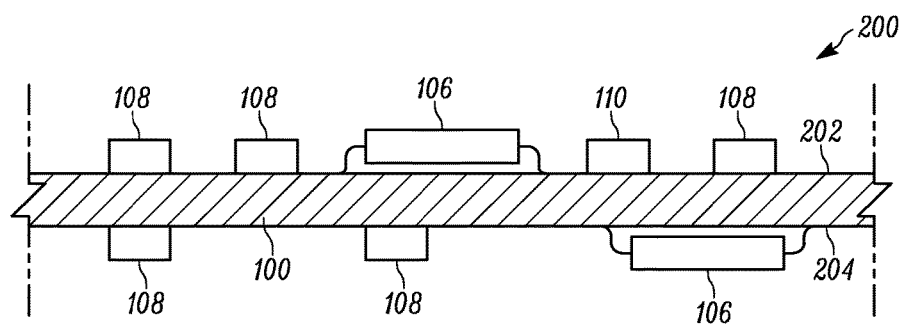
FIG. 2 is a partial side view of an exemplary circuit substrate, which could correspond to the circuit substrate illustrated in FIG. 1.

FIG. 2 illustrates a partial side view 200 of an exemplary circuit substrate, which could correspond to the circuit substrate 100 illustrated in FIG. 1. More specifically, the partial side view 200 more clearly illustrates the possible inclusion of components on both the front surface 202 and the back surface 204 of the circuit substrate 100. Such an arrangement supports the presence of nearby components on both the same and opposite sides of the circuit substrate 100.

Figure 3:
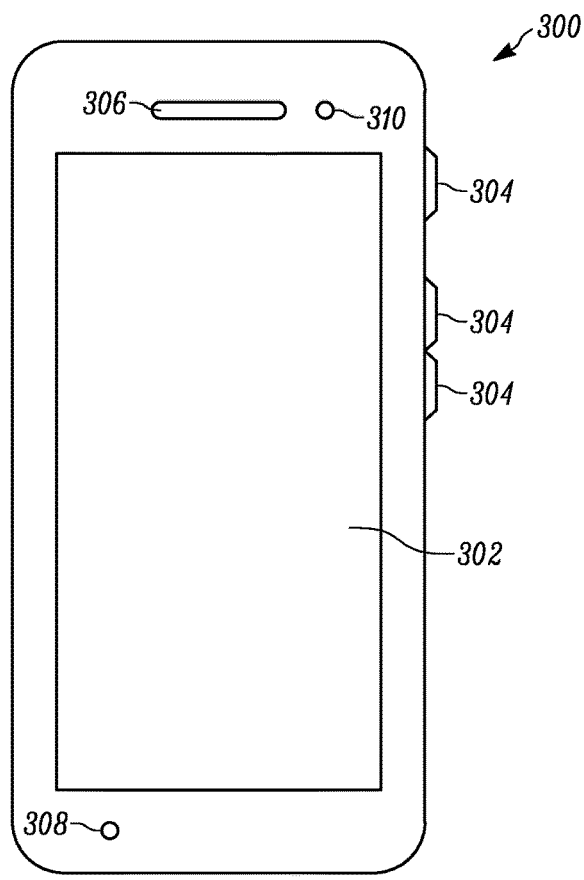
FIG. 3 is a front view of an exemplary hand held electronic device, such as a wireless communication device.

In many instances the circuit board will be included as part of another device. An example of one such device is illustrated in FIG. 3. More specifically, FIG. 3 illustrates a front view of an exemplary hand held electronic device, such as a wireless communication device, within which one or more circuit substrates illustrated in FIGS. 1 and 2 can be included. In addition to wireless communication devices, the circuit substrate can be included in other hand held devices beyond the type being specifically shown, as well as other non-hand held electronic devices. A couple of additional examples of suitable hand held electronic devices that may additionally be relevant to the present application in the incorporation of circuit substrates upon which components can be placed can include a tablet, a cordless telephone, a selective call receiver, an audio player, a gaming device, and a personal digital assistant.

There are countless examples of non-hand held electronic devices that can incorporate one or more circuit substrates, including televisions, personal computers, stereos, monitors, appliances, as well as trains, planes and automobiles. In essence, anywhere electronics are generally being used. However, the present application is well suited to instances, in which a component vibration can be conveyed to the circuit substrate, thereby resulting in a vibration in an audibly detectable frequency, whereby the resulting noise produced as part of the vibration is sufficiently loud so as to interfere with the enjoyable use of the electronic device.

In the illustrated example, the wireless communication device, such as a radio frequency cellular telephone 300 includes a display 302 which covers a large portion of the front facing. In at least some instances, the display can incorporate a touch sensitive matrix, that facilitate detection of one or more user inputs relative to at least some portions of the display, including interaction with visual elements being presented to the user via the display 302. In some instances, the visual element could be an object with which the user can interact. In other instances, the visual element can form part of a visual representation of a keyboard including one or more virtual keys and/or one or more buttons with which the user can interact and/or select for actuation. In any event, the functionality of the display is often supported with power and control circuitry included as part of circuit substrate, that is positioned proximate the display. In addition to one or more virtual user actuatable buttons or keys, the device 300 can include one or more physical user actuatable buttons 304, similarly supported via related electronic circuitry, which may also be present on one or more circuit substrates. In the particular embodiment illustrated, the device has three such buttons located along the right side of the device.

The exemplary hand held electronic device, illustrated in FIG. 3, additionally includes a speaker 306 and a microphone 308 in support of voice communications. The speaker 306 may additionally support the reproduction of an audio signal, which could be a stand-alone signal, such as for use in the playing of music, or can be part of a multimedia presentation, such as for use in the playing of a movie, which might have at least an audio as well as a visual component. The speaker may also include the capability to also produce a vibratory effect. However, in some instances, the purposeful production of vibrational effects may be associated with a separate element, not shown, which is internal to the device. Generally, the speaker is located toward the top of the device, which corresponds to an orientation consistent with the respective portion of the device facing in an upward direction during usage in support of a voice communication. In such an instance, the speaker 306 might be intended to align with the ear of the user, and the microphone 308 might be intended to align with the mouth of the user. Also located near the top of the device, in the illustrated embodiment, is a front facing camera 310, which generally also has associated therewith supporting electronic circuitry.

Because the device has an audio detection component, via the microphone 308, and an audio reproduction component, via the speaker 306, any unintended source of audio signals (i.e. noise), such as through a board vibration has the potential to be more noticeable and/or problematic for the user, as well as have a greater potential to interfere with the enjoyable use of the device.

The wireless communication device will also generally include a radio frequency transceiver, as well as associated transmit and receive circuitry, such as a radio frequency power amplifier, which can involve the use and production of one or more relatively high powered signals, as well as supply lines to high current components, that may involve circuit elements, such as one or more capacitors in the production, management and conditioning of the signal or supply. The strength of the signal, as well as the periodic nature of the signal results in an increased chance that the signal will produce parasitic effects in other components. More specifically, the supply lines to high current components for which one or more capacitors may be associated may result in high levels of pulsing in the signals across the capacitor terminals, which has the potential to produce a periodic deformation in the associated capacitors.

Figure 4:
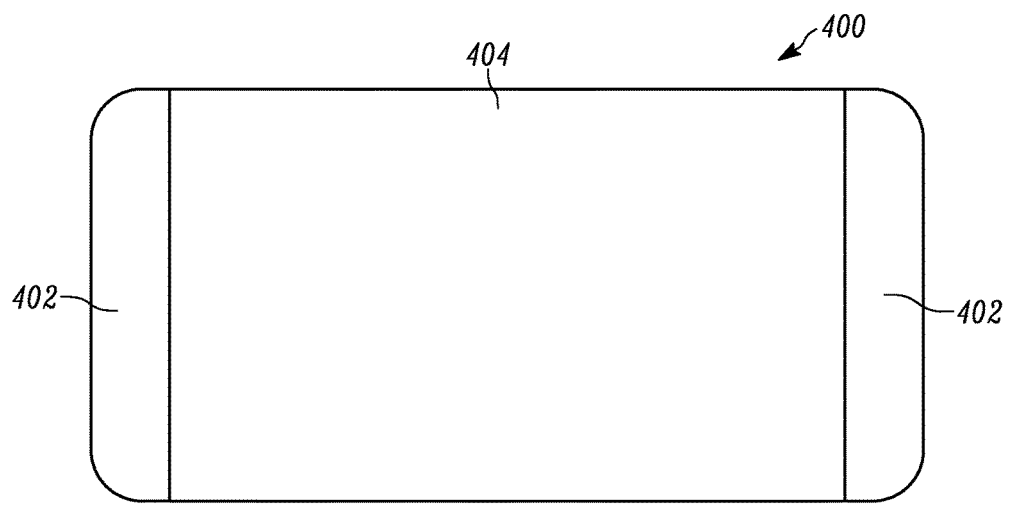
FIG. 4 is a top view of an exemplary capacitor, such as a surface mount multilayer ceramic chip capacitor.

FIG. 4 illustrates a top view of an exemplary capacitor, such as a surface mount multilayer ceramic chip capacitor 400. The capacitor will generally have a pair of terminals 402, which are respectively located at opposite ends of the capacitor body 404. The terminals 402 are generally conductive in nature often being at least partially formed with a nickel or tin plating. The terminals 402 are often sized and shaped so as to facilitate a soldered coupling to appropriately positioned pads present on the circuit substrate 100 from which one or more conductive traces, formed as part of the circuit substrate, can facilitate an electronic coupling to other electronic circuit elements that may similarly be coupled to and/or formed as part of the circuit substrate 100.

FIGS. 5A through 5D illustrate various different internal side views of an exemplary capacitor highlighting the orientation and arrangement of multiple substantially parallel conductive plates situated within the exemplary capacitor. More specifically FIG. 5A illustrates an internal side view 500 showing the plurality of substantially parallel conductive plates 502 arranged in a vertical stack, where conductive plates 502 are substantially parallel to each other. FIG. 5B illustrates an internal end view 504 showing the plurality of substantially parallel conductive plates 502 arranged in a vertical stack. FIG. 5C illustrates an internal top view 506 showing the plurality of substantially parallel conductive plates 502 looking down from the top of the stack. FIG. 5D illustrates a rotated internal end view 508 showing the plurality of substantially parallel conductive plates 502 oriented vertically and arranged side by side.

Each conductive plate 502 extends from one of the terminals 402 located at opposite ends of the capacitor body 404 into the space within the body 404 between the terminals 402, where every other one of the conductive plates 404 in the stack are each coupled to a particular one of the terminals 402, such that every adjacent pair of plates in the stack includes a plate extending from a different one of the two terminals 402. In many instances, the space between the plates includes a dielectric material, which in conjunction with the distance between the plates and the area of overlap in the plates, can be used to define the corresponding capacitance value for the component.

When a voltage differential is applied to the terminals, the voltage differential will be applied across each of the adjacent set of plates. In practice, a high level of pulsing associated with the applied voltage differential has resulted in the plates being attracted towards each other due to the force created on the plates as a result of the charge distribution. In turn, this can result in a deformation of the external side walls of the capacitor, as illustrated by dashed lines 509. Where the external side wall is substantially parallel to the plate capacitors, the deflection is effectively inward. The direction of inward deflection is illustrated by three corresponding sets of arrows 510 and dashed lines 509 illustrated in each of FIGS. 5A, 5B and 5D. The inward deflection 510 of these sets of side walls causes the other sets of side walls to generally deflect outward, as illustrated by the other sets of arrows 512 and dashed lines 509 illustrated in each of FIGS. 5A, 5B, 5C and 5D. Depending upon which set of the external surfaces of the capacitor is adjacent to the circuit substrate 100, the corresponding deflection in the side wall of the capacitor can be conveyed to the circuit substrate 100.

Figure 6:
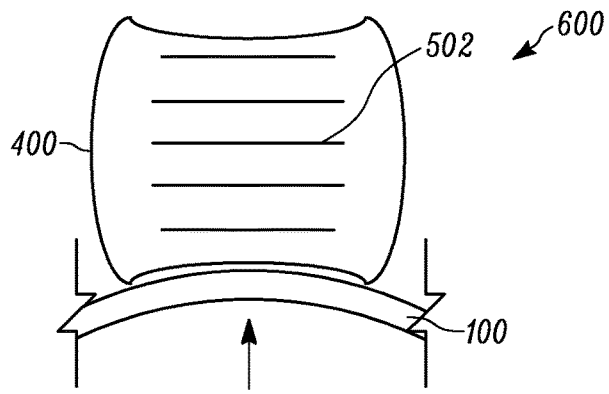
FIGS. 6 and 7 are partial block diagrams illustrating the interaction between an exemplary capacitor and circuit substrate, including an exemplary deformation in the capacitor based upon a voltage differential being applied across a pair of terminals and the particular orientation of the plate conductors within the capacitor.
Figure 7:
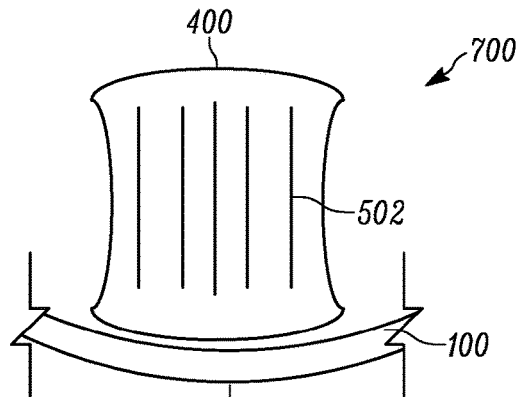

FIGS. 6 and 7 illustrate partial block diagrams 600 and 700 illustrating the interaction between an exemplary capacitor 400 and circuit substrate 100, including an exemplary deformation in the capacitor 400 based upon a voltage differential being applied across a pair of terminals and the particular orientation of the plate conductors 502 within the capacitor 400 so as to dictate the particular external wall of the capacitor which is in contact with the circuit substrate 100. When the external wall of the capacitor 400, which is substantially parallel to the to the conductive plates 502, is in contact with the circuit substrate 100, and when the voltage differential is received across the pair of terminals 402 of the capacitor 400, the corresponding side wall of the capacitor 400 will contract, thereby conveying a contraction force to the circuit substrate 100, as illustrated in FIG. 6. When the external wall of the capacitor 400, which is substantially perpendicular to the to the conductive plates 502, is in contact with the circuit substrate 100, and when the voltage differential is received across the pair of terminals 402 of the capacitor 400, the corresponding side wall of the capacitor 400 will expand, thereby conveying an expansion force to the circuit substrate 100, as illustrated in FIG. 7.

By conveying one or more expansion and/or contraction forces to the circuit substrate 100, the effect of one or more vibrational point sources may be introduced relative to the circuit substrate 100. Dependent upon their position, frequency and amplitude, the one or more point sources may have the potential to create one or more standing waves in the circuit substrate 100 at various frequencies. If the resulting standing waves have a frequency corresponding to an audibly detectable frequency, and the amplitude of the standing wave is sufficiently large, the board vibration may result in an audibly detectable source of noise, which may be undesirable.

Figure 8:
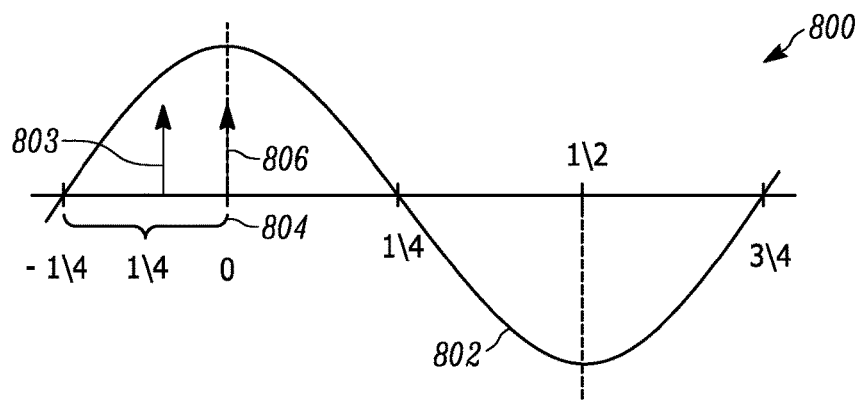
FIG. 8 is a graph of a partial exemplary waveform of a signal having a wavelength of lambda.

FIG. 8 illustrates a graph 800 of a partial exemplary waveform of a signal 802 having a wavelength of lambda. Where a particular circuit substrate experiences vibrations from multiple point sources at a related frequency, the multiple point sources have the potential to constructively or destructively interfere. Dependent upon any frequency and/or phase difference, as well as the spacing between the multiple sources. Where the components are being driven by a complementary signal, the frequencies are often substantially similar, and the phase difference is generally negligible. Correspondingly, a similar vibrational source 803 applied within a quarter wavelength 804 of another vibrational source 806 at particular frequency of interest will often add in a constructive manner.

Figure 9:
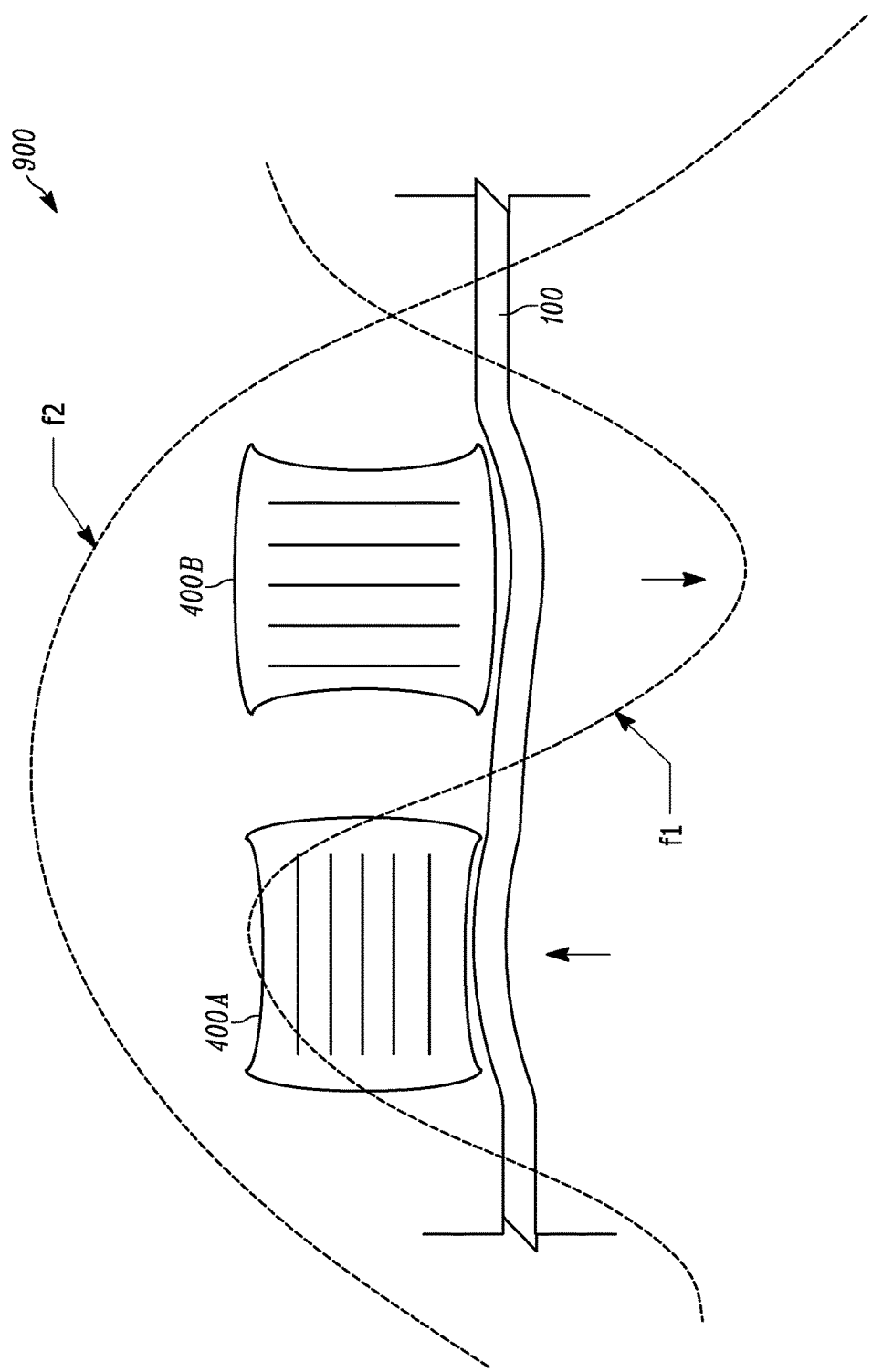
FIG. 9 is a partial block diagram illustrating an exemplary interaction between a pair of exemplary capacitors and the same side surface of a circuit substrate.

FIG. 9 illustrates a partial block diagram 900 illustrating an exemplary interaction between a pair of exemplary capacitors 400 and the same side surface of a circuit substrate 100. Assuming both capacitors are being driven by a complementary signal, the orientation of the first capacitor 400A will produce a contraction force at the same time that the second capacitor 400B produces an expansion force. Given their relative spacing, such an excitation will constructively add for some frequencies f1, and destructively add for other frequencies f2. Depending upon which one of the frequencies might correspond to a frequency in the circuit substrate that might produce a perceivable source of audible noise, the illustrated configuration may be inconsequential or problematic. If f1 is the frequency of interest, the illustrated configuration has a greater chance of being a problem. However, if f2 is the frequency of interest, then the particular arrangement is likely to produce vibrations that will destructively interfere, and thereby has an increased chance to mitigate the potential for noise concerns. As such, dependent upon the frequencies of interest, the placement of capacitors can be managed including spacing and orientation to minimize the effect of vibrations. Assuming f2 to be the particular signal of interest, by managing the spacing of the capacitors as being within one quarter wavelength, and orienting the capacitors so as to at the same time alternatively expand and contract, the capacitors will exert opposing influences, or influences that destructively add at the frequency of interest.

It may be beneficial to test the amount of compression and expansion from the various surfaces of a component in order to determine an expected amount along each of the different sets of surfaces for each of the components of concern. Different sized components may produce more or less of an effect for which it may be beneficial to group multiple types of distortion from one or more components to counteract the amount of the opposite type of distortion to be expected from one or more other components. It is also possible that the same or similar components may produce differing amounts of compression in one orientation relative to the amount of expansion in the alternative orientation. For example, one type of component may produce N times the compression force along the respective surface, than the amount of expansion force along the alternative respective surface in the alternative orientation. In such an instance, it might be helpful to place a different number of the capacitors in a particular orientation, in order to balance the expected deformation from the capacitors in the alternative orientation when they are within a particular quarter wavelength grouping. In at least some instances, the same type of capacitors have at least sometimes produced a larger amount of distortion relative to the external side surfaces parallel to the plate conductors, than the amount of opposite distortion relative to the external side surface perpendicular to the plate conductors. Still further, it is possible that capacitors could be used to exert an opposite influence to counteract component deformations, if any, in at least some non-capacitor type components.

Generally, on the same side surface of a circuit substrate within the quarter wavelength spacing, components which are oriented to produce an expansion in the contact surface should be paired with components which are oriented to produce a compression in the contact surface in order to exert opposite influences on the circuit substrate.

Figure 10:
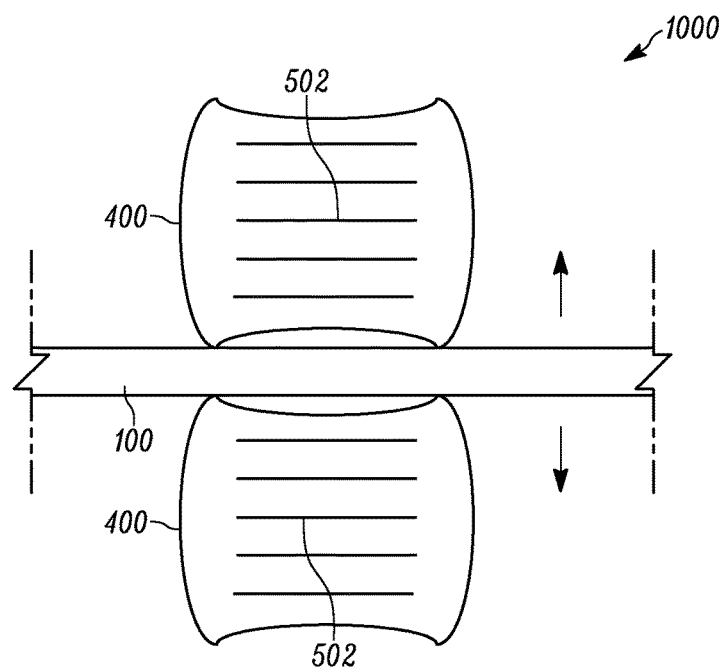
FIGS. 10 and 11 are partial block diagrams illustrating an exemplary interaction between a pair of exemplary capacitors and the opposite side surfaces of a circuit substrate.
Figure 11:
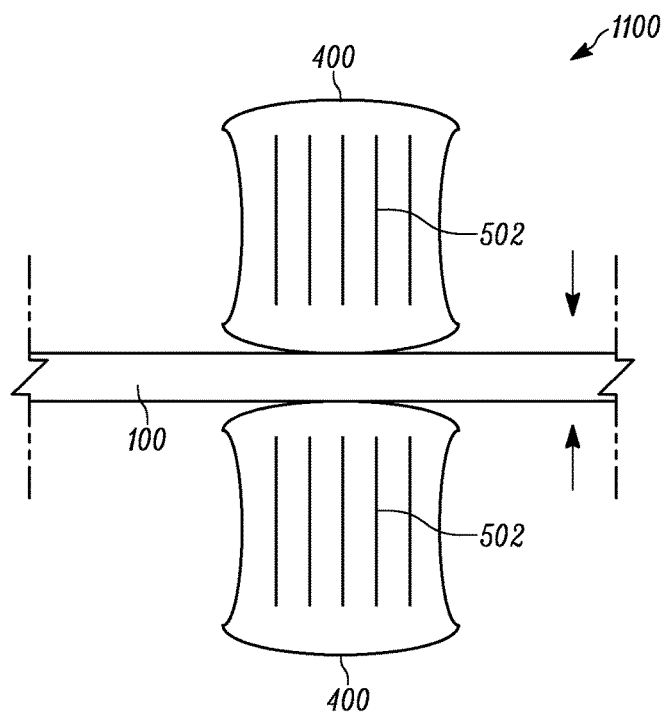

FIGS. 10 and 11 illustrate partial block diagrams 1000 and 1100 showing an exemplary interaction between a pair of exemplary capacitors 400 and the opposite side surfaces of a circuit substrate 100. In such an instance, the same type of surface distortion applied to opposite sides of a circuit substrate will exert opposite influences on the circuit substrate proximate the location of interest. In other words, a pair of capacitors located on opposite sides of a circuit substrate, which are similarly oriented, namely oriented to both either expand or contract, will exert opposite influences on the circuit substrate, which are also generally equal in nature.

Audible frequencies are commonly associated with frequencies in the range of 20 Hz to 20 KHz. However different frequencies in connection with this application will have different levels of concerns. In at least some instances, the inventors have recognized that frequencies in the range of 2000 to 5000 can be of slightly greater concern. Furthermore, the type of signal driving the capacitors that might produce such a vibration in an associated circuit substrate may involve a harmonic of the corresponding frequency. As such, several frequencies associated with power amplifiers for the radio frequency transmission for Global System for Mobile Communications (GSM) type systems have been found to produce frequencies of concern, namely in the noted audible range.

It has been noted, that in order to meaningfully constructively add or subtract, the vibrational sources should be driven by a complementary signal, namely a signal having a similar frequency and a similar phase shift. A complementary signal will be generally satisfied by a same or similar signal driving a plurality of capacitors in a particular grouping. This may involve the same signal source being applied to multiple components via one or more conductive traces. The components can be on the same or different branches of a particular conductive trace.

In addition to circuit substrates, such as printed circuit boards, the components may produce audible frequencies in other structures including metal shields that might be mounted to the printed circuit board. The larger surface area of the circuit substrate and/or metal structures will often have a larger surface area, which allows for surface vibrations that can be relatively larger than the type of surface vibrations that might be produced only in the component, i.e. the capacitor, itself.

Figure 12:
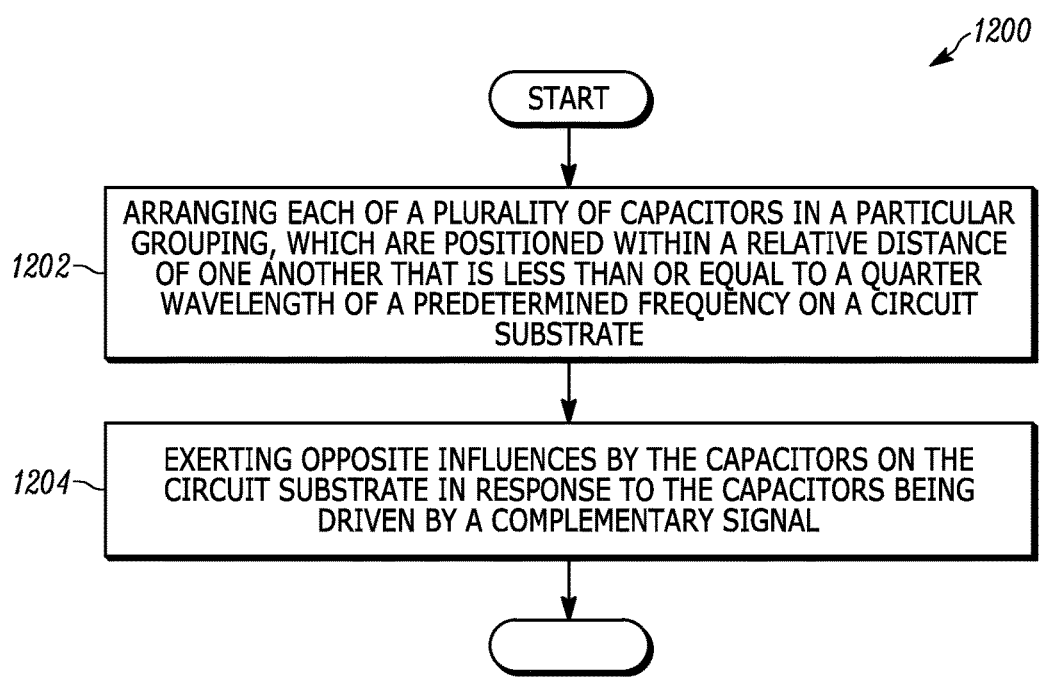
FIG. 12 is a flow diagram of a method of managing the placement of one or more groupings of capacitors coupled to a circuit substrate.

FIG. 12 illustrates a flow diagram 1200 of a method of managing the placement of one or more groupings of capacitors coupled to a circuit substrate. The method includes arranging 1202 each of a plurality of capacitors in a particular grouping, which are positioned within a relative distance of one another that is less than or equal to a quarter of a predetermined frequency on a circuit substrate. The method further includes, the capacitors exerting 1204 opposite influences on the circuit substrate in response to the capacitors being driven by a complimentary signal.

Figure 13:
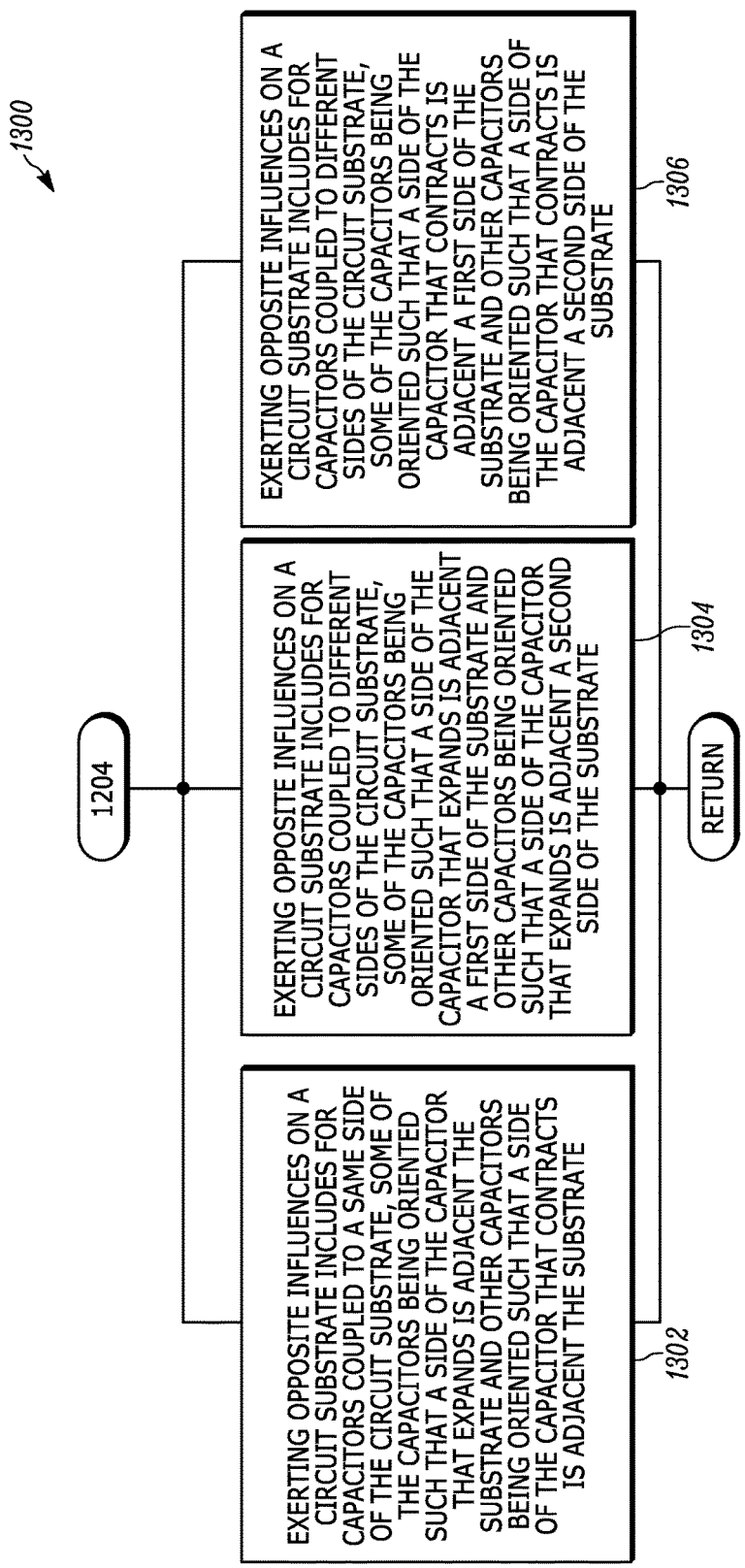
FIG. 13 is a flow diagram of exerting opposite influences on a circuit substrate.

FIG. 13 illustrates a flow diagram 1300 of exerting opposite influences on a circuit substrate, where exerting 1302 opposite influences on a circuit substrate can include for capacitors coupled to a same side of the circuit substrate, some of the capacitors being oriented such that a side of the capacitor that expands is adjacent the substrate, and some of the capacitors being oriented such that a side of the capacitor that contracts is adjacent the substrate. Furthermore, exerting 1304 opposite influences on a circuit substrate can additionally or alternatively include for capacitors coupled to different sides of the circuit substrate, some of the capacitors being oriented such that a side of the capacitor that expands is adjacent a first side of the substrate, and other capacitors being oriented such that a side of the capacitors that expands is adjacent a second side of the substrate. Still further, exerting 1306 opposite influences on a circuit substrate can additionally or alternatively include for capacitors coupled to different sides of the circuit substrate, some of the capacitors being oriented such that a side of the capacitor that contracts is adjacent a first side of the substrate, and other capacitors being oriented such that a side of the capacitors that contracts is adjacent a second side of the substrate.

Alternatively, surface mounted components other than capacitors may induce vibration into the substrate. In this case, a dissimilar component such as a module 104 or integrated circuit 106 may be a source of vibration in the substrate. To mitigate this possibility a capacitor or capacitors, with equivalent vibrational energy to the module 104 or integrated circuit 106, may be mounted proximate to the module 104 or integrated circuit 106 in such a manner that the vibration of the capacitors, and the module or integrated circuit cancel and/or oppose one another.

While the preferred embodiments have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A method of managing the placement of one or more groupings of a plurality of capacitors coupled to a circuit substrate, where each capacitor has a pair of terminals, as well as a component shape which changes as a voltage difference is selectively applied across the pair of terminals, where when a voltage difference is applied across the pair of terminals, the component shape of the capacitor will contract in a first direction and expand in a second direction, where the second direction is substantially orthogonal to the first direction, and where when the voltage difference is removed from the pair of terminals, the component shape of the capacitor will return to an uncontracted state in the first direction and an unexpanded state in the second direction, and where each of the plurality of capacitors in a particular grouping is driven by a complementary signal, the method includes:

arranging each of the plurality of capacitors in the particular grouping, which are positioned within a relative distance of one another that is less than or equal to a quarter wavelength of a predetermined frequency, where at least some of the plurality of capacitors in the particular grouping are positioned to exert opposite influences on the circuit substrate in a direction normal to a surface of the circuit substrate upon which the capacitors are placed relative to other capacitors in the particular group, in response to the plurality of capacitors in the particular grouping being driven by the complementary signal.

2. A method in accordance with claim 1, wherein the complementary signal includes one or more signals having a similar frequency and a similar phase.

3. A method in accordance with claim 1, wherein the complementary signal includes a same signal driving each of the plurality of capacitors in the particular grouping.

4. A method in accordance with claim 1, wherein exerting opposite influences on the circuit substrate include a grouping of a plurality of capacitors, which have multiple capacitors coupled to a same side of the circuit substrate, where one or more of the plurality of capacitors are oriented such that a side of the capacitor that expands when the voltage differential is received across the pair of terminals is positioned adjacent the circuit substrate, and where a different one or more of the plurality of capacitors are oriented such that a side of the capacitor that contracts when the voltage differential is received across the pair of terminals is positioned adjacent the circuit substrate.

5. A method in accordance with claim 1, wherein exerting opposite influences on the circuit substrate include a grouping of a plurality of capacitors, which have multiple capacitors coupled to different sides of the circuit substrate, where one or more of the plurality of capacitors are oriented such that a side of the capacitor that expands when the voltage differential is received across the pair of terminals is positioned adjacent a first side of the circuit substrate, and where a different one or more of the plurality of capacitors are oriented such that a side of the capacitor that expands when the voltage differential is received across the pair of terminals is positioned adjacent a second side of the circuit substrate, which is opposite the first side of the circuit substrate.

6. A method in accordance with claim 1, wherein exerting opposite influences on the circuit substrate include a grouping of a plurality of capacitors, which have multiple capacitors coupled to different sides of the circuit substrate, where one or more of the plurality of capacitors are oriented such that a side of the capacitor that contracts when the voltage differential is received across the pair of terminals is positioned adjacent a first side of the circuit substrate, and where a different one or more of the plurality of capacitors are oriented such that a side of the capacitor that contracts when the voltage differential is received across the pair of terminals is positioned adjacent a second side of the circuit substrate, which is opposite the first side of the circuit substrate.

7. A method in accordance with claim 1, wherein an aggregate amount for each of the opposite influences being exerted on a circuit substrate for the particular grouping is selected so as to be substantially similar.

8. A method in accordance with claim 1, wherein each capacitor includes multiple plate conductors in a stack, where adjacent ones of the plate conductors in the stack of plate conductors are coupled to a different one of the pair of terminals.

9. A method in accordance with claim 8, wherein each plate conductor has a front facing and a back facing and an edge which extends around the outer circumference of the front and back facings, and wherein the capacitor will contract when a voltage differential is applied across the pair of terminals in a direction substantially perpendicular to the front and back facings.

10. A circuit substrate comprising:
one or more groupings of capacitors, each grouping including a plurality of capacitors driven by a complementary signal, wherein each capacitor has a pair of terminals, and a component shape, which changes when a voltage difference across the two terminals is selectively applied, where the component shape of the capacitor will contract in a first direction and expand in a second direction, where the second direction is substantially orthogonal to the first direction, and where when the voltage difference is removed from the pair of terminals, the component shape of the capacitor will return to an uncontracted state in the first direction and an unexpanded state in the second direction;
wherein the plurality of capacitors in a particular grouping are positioned within a relative distance of one another that is less than or equal to a quarter wavelength of a predetermined frequency, where at least some of the plurality of capacitors in the particular grouping are positioned to exert opposite influences on the circuit substrate in a direction normal to a surface of the circuit substrate upon which the capacitors are placed relative to other capacitors in the particular group, in response to the plurality of capacitors in the particular grouping being driven by the complementary signal.

11. A circuit substrate in accordance with claim 10, wherein the complementary signal includes one or more signals having a similar frequency and a similar phase.

12. A circuit substrate in accordance with claim 10, wherein the complementary signal includes a same signal driving each of the plurality of capacitors in the particular grouping.

13. A circuit substrate in accordance with claim 10, wherein positioning to exert opposite influences on the circuit substrate includes a grouping of a plurality of capacitors, which have multiple capacitors coupled to a same side of the circuit substrate, where one or more of the plurality of capacitors are oriented such that a side of the capacitor that expands when the voltage differential is received across the pair of terminals is positioned adjacent the circuit substrate, and where a different one or more of the plurality of capacitors are oriented such that a side of the capacitor that contracts when the voltage differential is received across the pair of terminals is positioned adjacent the circuit substrate.

14. A circuit substrate in accordance with claim 10, wherein positioning to exert opposite influences on the circuit substrate includes a grouping of a plurality of capacitors, which have multiple capacitors coupled to different sides of the circuit substrate, where one or more of the plurality of capacitors are oriented such that a side of the capacitor that expands when the voltage differential is received across the pair of terminals is positioned adjacent a first side of the circuit substrate, and where a different one or more of the plurality of capacitors are oriented such that a side of the capacitor that expands when the voltage differential is received across the pair of terminals is positioned adjacent a second side of the circuit substrate, which is opposite the first side of the circuit substrate.

15. A circuit substrate in accordance with claim 10, wherein positioning to exert opposite influences on the circuit substrate includes a grouping of a plurality of capacitors, which have multiple capacitors coupled to different sides of the circuit substrate, where one or more of the plurality of capacitors are oriented such that a side of the capacitor that contracts when the voltage differential is received across the pair of terminals is positioned adjacent a first side of the circuit substrate, and where a different one or more of the plurality of capacitors are oriented such that a side of the capacitor that contracts when the voltage differential is received across the pair of terminals is positioned adjacent a second side of the circuit substrate, which is opposite the first side of the circuit substrate.

16. A circuit substrate in accordance with claim 10, wherein an aggregate amount for each of the opposite influences being exerted on a circuit substrate for the particular grouping is selected so as to be substantially similar.

17. A circuit substrate in accordance with claim 10, wherein each capacitor includes multiple plate conductors in a stack, where adjacent ones of the plate conductors in the stack of plate conductors are coupled to a different one of the pair of terminals.

18. A circuit substrate in accordance with claim 17, wherein each plate conductor has a front facing and a back facing and an edge which extends around the outer circumference of the front and back facings, and wherein the capacitor will contract when a voltage differential is applied across the pair of terminals in a direction substantially perpendicular to the front and back facings.

19. A circuit substrate in accordance with claim 10, wherein the circuit substrate further comprises one or more additional components dissimilar to the capacitors included in the one or more groupings, which in response to the complementary signal will produce an expansion or contraction relative to a surface of the additional component that is in contact with the circuit substrate when the voltage differential is received, wherein a capacitor from the one or more groupings, which is positioned proximate the additional component will be oriented relative to the circuit substrate so as to exert an opposite influence on the circuit substrate than the additional component when the voltage differential associated with complementary signals is respectively received across a pair of terminals in each of the additional component and the capacitor positioned proximate the additional component.

20. A circuit substrate in accordance with claim 10, which is incorporated as part of a wireless communication device.

21. A circuit substrate in accordance with claim 20, wherein the complementary signal includes a radio frequency power amplifier signal.

* * * * *